United States Patent [19]
Wong

[11] Patent Number: 5,365,198
[45] Date of Patent: Nov. 15, 1994

[54] WIDEBAND AMPLIFIER CIRCUIT USING NPN TRANSISTORS

[75] Inventor: Stephen L. Wong, Scarsdale, N.Y.

[73] Assignee: Philips Electronics North America Corporation, New York, N.Y.

[21] Appl. No.: 125,995

[22] Filed: Sep. 23, 1993

[51] Int. Cl.$^5$ ............................................. H03F 3/04
[52] U.S. Cl. .................... 330/288; 330/257; 330/311
[58] Field of Search ............... 330/288, 296, 257, 311, 330/306; 307/296.1

[56] References Cited

U.S. PATENT DOCUMENTS

| | | | |
|---|---|---|---|
| 3,399,357 | 8/1968 | Weilerstein | 330/22 |
| 4,013,973 | 3/1977 | van de Plassche | 330/30 D |
| 4,591,804 | 5/1986 | van Tuijl | 330/311 |
| 5,045,807 | 9/1991 | Ishihara et al. | 330/260 |

OTHER PUBLICATIONS

FIG. 4.26(B) of Analysis and Design of Analog Integrated Circuits, Second Edition, Gray & Meyer, John Wiley & Sons, 1977, p. 285.

Primary Examiner—James B. Mullins
Assistant Examiner—James Dudek
Attorney, Agent, or Firm—Steven R. Biren

[57] ABSTRACT

A wideband amplifier circuit provides high current gain and a wide bandwidth by employing only npn transistors, which have better high-frequency characteristics than those of pnp transistors, in the signal path. Wideband current amplification is achieved using npn transistors in a current-mirror configuration, with base-emitter voltage matching to permit the current gain to be easily set as a function of transistor area. The wideband amplifier circuit can also be used in a differential wideband amplifier configuration to obtain a combination of high current gain, wide bandwidth and wide output swing not obtainable with conventional differential amplifiers.

5 Claims, 1 Drawing Sheet

WIDEBAND AMPLIFIER CIRCUIT USING NPN TRANSISTORS

BACKGROUND OF THE INVENTION

This invention is in the field of transistor amplifier circuits, and relates more particularly to amplifier circuits capable of providing both a wide bandwidth and high gain.

Typical single-stage prior-art differential or single-ended amplifier circuits are capable of providing a wide bandwidth and good high-frequency characteristics, but such simple circuits suffer the drawback of not being capable of providing a high current gain, and may not have a full output swing. Even more complex wideband amplifier circuits, such as those shown in U.S. Pat. Nos. 3,399,357 and 5,045,807, may not supply a sufficiently high current gain or output swing for all circuit applications.

One typical prior-art technique for increasing the current gain of a circuit is to provide a pair of current mirrors, one operating off the "high side" (the power supply bus) and the other operating off the "low side" (ground). A typical current amplifying circuit of this type is shown in FIG. 4.26(b) of ANALYSIS AND DESIGN OF ANALOG INTEGRATED CIRCUITS, Second Edition, Gray & Meyer, John Wiley & Sons, 1977, Page 285. In this self-biased Zener bias reference circuit, a first pair of transistors (Q6, Q7) is connected as the high-side current mirror, with transistors Q2 and Q3 forming the low-side current mirror. However, it is noted that this configuration is used in a DC circuit, and that the necessity for using PNP transistors for Q6 and Q7 in the high-side current mirror would substantially degrade the high-frequency performance of this conventional circuit if it were to be used in a wideband amplifier.

Accordingly, it would be desirable to have a wideband amplifier, in either single-ended or differential form, which would offer high current gain while maintaining a wide bandwidth and good high-frequency characteristics. Additionally, it would be desirable for such a circuit to be simple and compact in design, and economical to manufacture.

SUMMARY OF THE INVENTION

It is thus an object of the invention to provide an amplifier circuit which can be used in either a single-ended or differential configuration and which provides a wide bandwidth and good high-frequency characteristics while at the same time providing a relatively high current gain. It is a further object of the invention to provide a wide bandwidth, high-gain amplifier which is both simple and compact in design and economical to manufacture.

In accordance with the invention, these objects are achieved by a new wideband amplifier circuit which uses only npn transistors in the signal path, for improved high-frequency performance and ease of manufacture, and which accordingly provides substantial current gain, without using pnp transistors as in a typical prior-art high-side current mirror. Additionally, by appropriately selecting the base-emitter voltages of selected npn transistors, the current gain of the amplifier can be determined by a constant factor proportional to the area ratio of two specific transistors in the amplifier circuit.

In simplest form, the wideband amplifier is configured as a single-ended current amplifier, but a single-ended voltage amplifier can be obtained by providing an npn input transistor with its base serving as the input terminal of the amplifier, and a resistive load coupled across the amplifier output. Furthermore, two of the last-described amplifier circuits may be combined to form a wideband differential amplifier circuit by connecting the emitters of the two last-mentioned transistors together to form a differential amplifier input stage.

BRIEF DESCRIPTION OF THE DRAWING

The invention may be more completely understood with reference to the following detailed description, to be read in conjunction with the accompanying drawing, in which.

DESCRIPTION OF THE PREFERRED EMBODIMENTS

Figure 1:
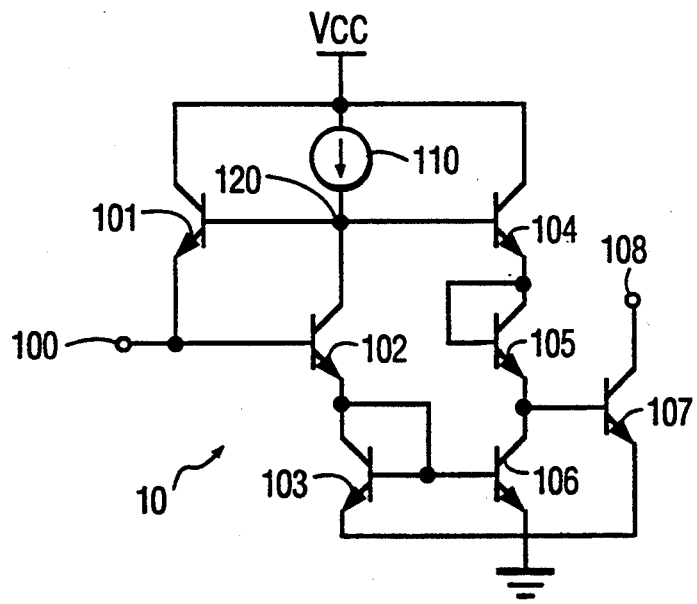
FIG. 1 shows a schematic diagram of a wideband amplifier circuit in accordance with a first embodiment of the invention.

A wideband amplifier circuit 10 in accordance with the invention is shown in schematic form in FIG. 1. The wideband amplifier circuit 10 includes an amplifier input 100 connected to the emitter of a first npn bipolar transistor 101 and the base of a second npn bipolar transistor 102. The collector of transistor 101 is connected to a positive voltage Vcc (the high side of the power supply), and the base of transistor 101 is connected to the collector of transistor 102. The emitter of transistor of 102 is connected to the collector and base of npn bipolar transistor 103, with the emitter of transistor 103 being connected to ground (the low side of the power supply). Transistors 101, 102 and 103 collectively provide a first current path between Vcc and ground.

A second current path between Vcc and ground is formed by npn bipolar transistors 104, 105 and 106, with the collector of transistor 104 being connected to Vcc, its base being connected to the base of transistor 101 and its emitter being connected to the collector and base of transistor 105. The emitter of transistor 105 is connected to the collector of transistor 106, with the base of transistor 106 being connected to the base of transistor 103 and the emitter of transistor 106 being connected to ground. It should be noted that in this circuit the transistors 103 and 105 are configured as "diode-connected transistors", and it is to be understood that although this configuration is used rather than a simple pn junction diode for ease of fabrication and isolation, these diode-connected transistors could in fact be replaced by simple pn junction diodes with appropriate fabrication and isolation techniques, and are functionally fully equivalent thereto. Accordingly, the term "diode-connected transistors", as used herein, is intended to encompass pn junction diodes.

The output portion of the circuit is formed by npn bipolar transistor 107, the base of which is connected to the emitter of transistor 105 and of the collector of transistor 106 and the emitter of which is connected to ground. The amplifier output is taken from the collector of transistor 107, at terminal 108.

The wideband amplifier circuit 10 of FIG. 1 is completed by a current source 110 which is connected from Vcc to the point at which the bases of transistors 101 and 104 and the collector of transistor 102 are connected. Current source 110, shown in schematic form in FIG. 1, may in practice be a simple resistor, or an appropriately-biased MOS or bipolar transistor, in a manner well known to those skilled in the art. Since the current source 110 is not in the signal path, it need not be provided as an npn bipolar transistor if an active component is used.

The wideband amplifier circuit 10, as previously described, is suitable for use as a single-ended current amplifier, with a current input being provided input terminal 100, and a current output being taken from output terminal 108. However, as shown in FIG. 2, by providing the wideband amplifier circuit 10 with a further npn bipolar transistor 200, having its collector connected to terminal 100, its emitter connected to ground, and its base connected to input terminal 202, and by connecting the output terminal 108 through a resistive load 204 to Vcc, a single-ended voltage amplifier can be obtained.

Figure 2:
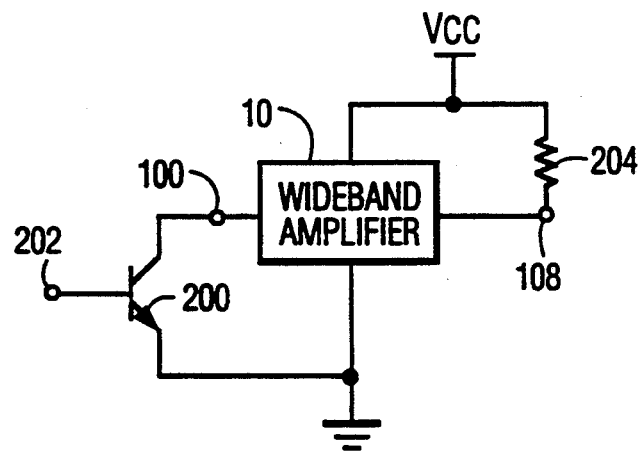
FIG. 2 shows a partially-schematic and partially-block diagram of a wideband amplifier circuit in accordance with a second embodiment of the invention.
Figure 3:
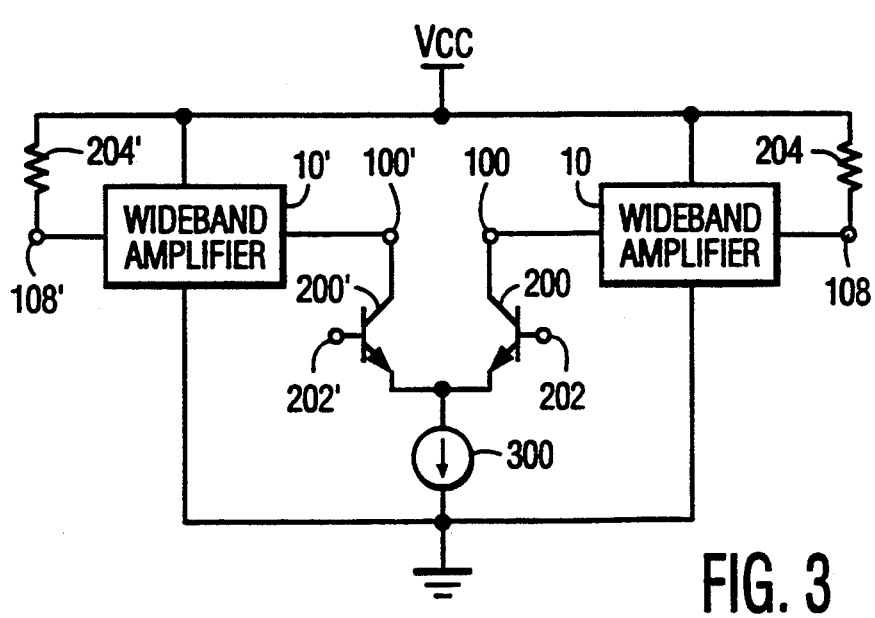
FIG. 3 shows a wideband differential amplifier circuit in accordance with a third embodiment of the invention.

In order to obtain a wideband differential amplifier circuit, two single-ended amplifiers as shown in FIG. 2 can be combined and connected as shown in FIG. 3. In this Figure, the components of the left-hand amplifier circuit are designated with primed referenced numerals, with the same numerals being used for the left-hand and right-hand portions of the circuit. In the circuit, the input transistors 200 and 200' have their emitters connected together, and connected to ground through a current source 300. This current source, shown schematically in FIG. 3, may be in practice be a simple resistor or an appropriately-biased MOS or bipolar transistor, in a manner well known to those skilled in the art. In the circuit of FIG. 3, a differential input is applied to terminals 202 and 202' and a differential output is taken across terminals 108 and 108' to achieve the desired wideband differential amplifier configuration.

With reference to the circuit shown in FIG. 1, an input current applied to terminal 100 is mirrored and amplified by transistors 101-107 to produce an amplified version of the input current at the output terminal 108. If a voltage amplifier is desired, the embodiment of FIG. 2 is used, in which case a voltage input is applied to the input terminal 202 at the base of transistor 200, and an amplified voltage output is obtained across load resistance 204 at output terminal 108. In either case, current mirroring and amplification is accomplished within the circuit of FIG. 1 without the use of a prior-art pnp current mirror on the high side.

In the circuit of FIG. 1, the base-emitter junctions of transistors 101, 102 and 103 are connected in series between the node 120 and ground, with the base-emitter voltages of transistors 104, 105 and 107 likewise being connected in series between node 120 and ground. Thus, the sum of the base-emitter voltages of transistors 101, 102 and 103 must equal the sum of the base-emitter voltages of transistors 104, 105 and 107. If the sum of the base-emitter voltages of transistors 102 and 103 are then made equal to the sum of the base-emitter voltages of transistors 104 and 105, by scaling the sizes of the transistors so that the current density (transistor current divided by the area of the emitter region) in transistors 102 and 103 equals that in transistors 104 and 105, then the base-emitter voltage of transistor 101 will necessarily be equal to that of transistor 107, and the current in transistor 107 will change with the current in transistor 101, with the current in 107 being amplified by a constant factor proportional to the ratio of the areas of transistors 107 and 101. In this manner, a high-gain current amplifier is obtained in which the current gain can be easily set during manufacture by simply setting the area ratio of two transistors to the desired value. Furthermore, this circuit uses no pnp transistors in the signal path, thus taking advantage of the superior high-frequency characteristics of npn transistors to achieve a wide bandwidth in combination with excellent gain in a simple circuit configuration. It should again be noted that although npn transistors 103 and 105 are shown as diode-connected transistors since this configuration lends itself to ease of fabrication and good isolation, simple pn diodes could be used instead.

Finally, in FIG. 3, two wideband voltage amplifiers such as those shown in FIG. 2 are interconnected to achieve a wideband differential amplifier by connecting the emitters of npn input transistors 200 and 200' together and by coupling these emitters to ground through a current source 300. In this configuration, a differential input voltage is applied to the input terminals 202 and 202' of transistors 200 and 200', respectively, with a differential output voltage appearing across the output terminals 108 and 108', and with the intervening circuitry operating as described above. In addition to providing a substantially increased current gain as compared to a simple differential amplifier, the circuit of FIG. 3 offers the additional advantage of providing a full output voltage swing, a feature not obtainable with a conventional simple differential amplifier.

Despite their simplicity, the wideband amplifier circuits of the present invention offer several important advantages over the prior-art circuits. The basic circuit of FIG. 1 may be used as either a current amplifier or a voltage amplifier, and may be used in either a single-ended or a differential configuration. The circuits offer wide bandwidth, good high-frequency characteristics and a relatively high current gain in configurations which are simple and compact in design and economical to manufacture. Additionally, the differential configuration of the wideband amplifier circuit offers a wider output voltage swing than that of a conventional differential amplifier. Finally, all of the embodiments shown permit adjustment of the current gain in a simple manner during the manufacturing process.

While the invention has been particularly shown and described with reference to a preferred embodiment thereof, it will be understood by those skilled in the art that various changes in form and detail may be made without departing from the spirit and scope of the invention. Thus, for example, current source 110 may be a resistor, a bipolar transistor, or an MOS transistor, and diode-connected transistors 103 and 105 may be simple pn junction diodes instead of npn transistors.

What is claimed is:

1. A wideband amplifier circuit comprising a first current path between a positive and a negative supply line having first, second and third npn bipolar transistors, an amplifier input coupled to said first and second transistors, a second current path between said supply lines having fourth, fifth and sixth npn bipolar transistors, a seventh npn bipolar transistor for providing an amplifier output and coupled to said fifth and sixth transistors, and a first current source coupled between said positive supply line and the first, second and fourth transistors at a first junction, the base-emitter junctions of said first, second and third transistors being connected in series between said first junction and said negative supply and the base-emitter junctions of said fourth, fifth and seventh transistors being connected in series between said first junction and said negative supply, whereby the sum of the base-emitter voltages of said first, second and third transistors is equal to the sum of the base-emitter voltages of said fourth, fifth and seventh transistors.

2. A wideband amplifier circuit as in claim 1, wherein the sum of the base-emitter voltages of the second and third transistors is equal to the sum of the base-emitter voltages of the fourth and fifth transistors, and the base-emitter voltage of the first transistor is equal to the base-emitter voltage of the seventh transistor, the gain of the amplifier circuit being proportional to the ratio of the areas of the seventh and first transistors.

3. A wideband amplifier circuit as in claim 1, wherein said third and fifth transistors comprise diode-connected transistors, and said third and sixth transistors comprise a current mirror.

4. A wideband amplifier circuit as in claim 1, further comprising an eighth npn bipolar transistor having its collector coupled to said amplifier input, its emitter coupled to said negative supply line, and its base forming an input terminal, and a resistive load coupled between the collector of said seventh transistor and the positive supply line.

5. A wideband differential amplifier circuit comprising two wideband amplifier circuits each as in claim 4, wherein the emitters of said eighth transistors are connected together, and a second current source is coupled between said emitters and the negative supply line.

* * * * *